United States Patent
Loibl et al.

(10) Patent No.: US 8,300,415 B2
(45) Date of Patent: Oct. 30, 2012

(54) ELECTRONIC COMPONENT

(75) Inventors: Joseph Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 289 days.

(21) Appl. No.: 12/531,573

(22) PCT Filed: Feb. 13, 2008

(86) PCT No.: PCT/EP2008/051714
§ 371 (c)(1),
(2), (4) Date: Sep. 16, 2009

(87) PCT Pub. No.: WO2008/113645
PCT Pub. Date: Sep. 25, 2008

(65) Prior Publication Data
US 2010/0110644 A1 May 6, 2010

(30) Foreign Application Priority Data
Mar. 21, 2007 (DE) .......................... 10 2007 013 617

(51) Int. Cl.
*H05K 5/00* (2006.01)

(52) U.S. Cl. ........ 361/751; 361/600; 361/752; 361/753; 361/759

(58) Field of Classification Search .................. 361/600, 361/752–759, 800
See application file for complete search history.

(56) References Cited

U.S. PATENT DOCUMENTS

| | | | |
|---|---|---|---|
| 4,490,614 A | 12/1984 | Peerenboom et al. | |
| 5,038,250 A | 8/1991 | Uenaka et al. | |
| 5,497,297 A | 3/1996 | Kilmer et al. | |
| 6,818,821 B2 * | 11/2004 | Fujieda et al. | 174/394 |
| 6,919,529 B2 * | 7/2005 | Franzen et al. | 219/121.64 |
| 7,443,693 B2 * | 10/2008 | Arnold et al. | 361/800 |
| 2008/0087463 A1 | 4/2008 | Ingenbleek et al. | |
| 2008/0144290 A1 | 6/2008 | Brandt et al. | |

FOREIGN PATENT DOCUMENTS

| | | |
|---|---|---|
| DE | 3315655 A1 | 11/1983 |
| DE | 19914469 C1 | 6/2000 |
| DE | 102004033559 A1 | 2/2006 |
| EP | 0417648 A2 | 3/1991 |
| WO | 2005012042 A1 | 2/2005 |

OTHER PUBLICATIONS

International Search Report dated Aug. 6, 2008.

* cited by examiner

*Primary Examiner* — Yuriy Semenenko
*Assistant Examiner* — Andargie M Aychillhum
(74) *Attorney, Agent, or Firm* — Laurence A. Greenberg; Werner H. Stemer; Ralph E. Locher

(57) ABSTRACT

An electronic component for an integrated mechatronic system has at least two housing parts with at least one housing base, a housing cover, and an electrical connection between the components disposed in the interior of the housing and components located outside the housing. The electrical connection is fixed on the housing base. The housing cover is glued directly to the electrical connection and/or the housing base and, in this manner, enables lasting hermetically sealed protection for the sensitive electronic components.

11 Claims, 2 Drawing Sheets

ELECTRONIC COMPONENT

BACKGROUND OF THE INVENTION

1. Field of the Invention

The invention relates to an electronic assembly for integrated mechatronic systems with a housing cover, at least one electrical connection in the form of a printed circuit board, and a housing base; the invention also relates to a method for producing such an electronic assembly, in particular for transmission or engine controllers in the automotive industry.

Electronic assemblies for integrated mechatronic systems and in particular control devices generally have a plurality of electronic components, which are connected to other components outside the control device. They are normally inserted into special housings to protect them from environmental influences or mechanical stresses. The housings also fulfill an important shielding function. These functions become more important, the more components are used directly in situ as integrated mechatronic systems, in other words in particular electronic control systems, in a transmission or engine for example. They are subject to a plurality of environment-related requirements. As well as long-term stability and fail-safety of the controller, higher operating temperatures, chemical stresses due to engine or transmission oil and the mechanically stressful environment of the engine or transmission due to the constant vibration load also play a major role. It is therefore essential for the sensitive electronic systems to be protected from such influences as far as possible.

A correspondingly sealed connection with long-term stability between the housing cover and the housing base is required to allow reliable sealing from the environment outside the housing.

2. Prior Art

DE 10 2004 033 559 A1 describes a three-part structure of a housing for an electronic assembly, having a housing cover, at least one housing wall and a housing base to cover the substrate of the electronic system. A seal between the housing cover and the housing wall and/or the base is enabled in that a special sealing mass is introduced. The sealing mass according to the cited publication can also establish the adhesion between the housing wall and housing base and/or cover as a further function.

The disadvantage of this arrangement is that fatigue phenomena can occur in the sealing material during the course of the useful life of such a control device, in particular in a highly aggressive environment as with transmission control devices, which are surrounded by chemically extremely active transmission oil and at the same time have to withstand high temperatures. Therefore provision is generally made for rivets or screws to fix the cover in a sealed manner.

DE 33 15 655 A1 describes an electrical connection using flexible conductor tracks. The flexible conductor tracks are inserted at a connecting point between the housing base and the cover and are also sealed off by way of molded seals on the housing base and the cover. These flexible conductor tracks can be passed from the connecting point directly to the electrical assembly in the interior of the housing. This allows a relatively flexible arrangement of the components.

An arrangement for the sealed passage of a flexible printed circuit board through a housing wall joint is also known from DE 199 14 469 C1, with which two molded seals with a sealing profile are disposed in the joint region, producing a longitudinal displacement of the flexible printed circuit board when the two parts of the housing wall are joined.

This however also has the disadvantage that sealing by means of molded seals cannot withstand the high levels of stress imposed mechanically/by vibration and in respect of chemical stability over the entire useful life of the control device specifically in an aggressive environment and therefore the housing cover is also fixed using measures such as rivets or screws.

BRIEF SUMMARY OF THE INVENTION

The object of the invention is therefore to provide a housing for an electronic control device with an electronic connection between the interior of the housing and the exterior of the housing, which allows simple and flexible connection to components outside the housing and at the same time separates the fixing of the housing cover and the seal. The seal for the passage of the electrical connection should also be hermetically sealed and should withstand high levels of mechanical and chemical stresses over the entire useful life of the control device, even at high temperatures. According to the invention this is achieved by an apparatus as claimed and by a method for producing such an apparatus as claimed.

The invention proposes providing an electronic assembly for an integrated mechatronic system with a housing cover, at least one electrical connection in the form of a printed circuit board and with a housing base, wherein the housing cover is embodied in such a manner that it has planar regions in the edge region, which can be adhered to the electrical connection and/or to the housing base by means of at least one adhesive film. This allows separation of the function of the sealing material and in particular the molded seals from the function of fixing by means of adhesion. In particular time-consuming adhesion of the molded seal to the electrical connection and/or to the housing base, which can have a negative influence on the useful life of the molded seal, is superfluous. This arrangement also allows a flexible selection of materials for the molded seal, which according to the invention does not have to be compatible with adhesives. Also in contrast to the prior art there is no need for riveting screwing or mechanical pretensioning of the housing cover.

A printed circuit board known per se can be used as the electrical connection. The electrical connection advantageously consists of a flexible printed circuit board with conductor tracks. The flexible printed circuit board can consist for example of a lower polyimide base film, metallic conductor tracks disposed thereon embedded in an adhesive layer and an upper polyimide cover film. Multilayer flexible printed circuit boards or flexible partial printed circuit boards can particularly preferably be used as the electrical connection. According to the invention no special area has to be disposed on the surface of the electrical connection and/or of the housing base to allow the subsequent positioning of the housing cover by means of adhesion, as is the case for example when securing by means of soldering. The adhesive film is preferably fully compatible with both the respective surface of the flexible printed circuit board and also the surface of the housing base.

The housing base is preferably made of a plastic or a metallic material, particularly preferably aluminum. In one preferred embodiment of the invention the flexible printed circuit board is laminated onto the metallic housing base. This ensures reliable and economical fixing.

The housing cover can be made of any material, which allows adhesion to the surface of the electrical connection and/or of the housing base and at the same time offers the necessary EMC shielding values. For example a simple or metalized plastic molded unit can be inserted. In one advantageous embodiment however the housing cover is also made of a metallic material, such as sheet steel or aluminum for example. This provides greater long-term stability and better shielding values over the entire useful life of the control device. It is also possible to achieve a high diffusion density of the cover in this manner.

The housing cover preferably has a peripheral region on its underside, for example a depression or groove, which is suitable to receive the molded seal and maps its contours.

In one particularly preferred embodiment of the invention the at least one adhesion region of the housing cover is disposed within the peripheral depression for receiving the molded seal.

In a different embodiment of the invention the adhesion region of the housing cover can equally preferably also be disposed outside the depression for receiving the molded seal.

The adhesion of the housing cover to the corresponding attachment surface of the flexible film and/or of the housing base can be preferably achieved by laminating at least adhesive film into position, said adhesive film being cross-linked by heat and pressure. The adhesive film can be embodied as a single piece or can consist of a number of individual partial pieces. An acrylic adhesive film, which can be previously cross-linked and is of the type also used to laminate the flexible films onto the housing base, is preferably used as the adhesive film. As well as the above-mentioned acrylic film, an epoxy-based or phenol-based system can also be used as the material for the adhesive film.

By using the same material and the same method to laminate the flexible printed circuit boards and according to the invention also to fix the housing cover means that synergies can advantageously be used, allowing considerable cost reductions to be achieved.

To produce an inventive electronic assembly for an integrated mechatronic system, at least one electronic connection is applied to the housing base to establish connections to the electronic components in the interior of the housing and to the components outside the housing, a molded seal is inserted and the housing cover is then fixed directly to the corresponding region of the electronic connection and/or of the housing base by adhesion.

In one preferred embodiment of the invention at least one flexible printed circuit board is laminated onto a housing base made of aluminum. The flexible printed circuit board is particularly preferably fixed to the housing base using acrylic adhesive.

Connections between the electronic components disposed outside the housing and the electrical connection of the present invention can be produced in any known manner. Thus for example the connections can be produced in a releasable manner as plug-type connectors for example or in a non-releasable manner by soldering or welding for example. The electronic connection is particularly preferably connected directly both to the electronic assemblies in the interior of the housing and also to the signal emitters and receivers (in particular sensors, valves, etc.) outside the housing, particularly preferably by means of thick wire bonds. This allows partial failures due to damaged interfaces, such as plug-type connectors for example, to be avoided. This reduces susceptibility to error significantly.

Then in one preferred embodiment of the method the adhesive film is applied to the corresponding regions of the electronic connection and/or of the housing base. The adhesive film can then optionally be previously cross-linked by means of temperature and/or pressure. The molded seal is then inserted and the housing cover is connected to the prepared base set in a hermetically sealed manner at a higher temperature and pressure by cross-linking the adhesive film.

Alternatively the adhesive film can be applied to the corresponding regions of the housing cover and then be cross-linked first, before the housing cover, which has been thus prepared, is laminated onto the housing base, which is provided with at least one electronic connection and molded seal, by cross-linking the adhesive film.

The invention is described below in an exemplary manner with reference to two variants in conjunction with the drawing, in which:

DESCRIPTION OF THE INVENTION

Figure 1:
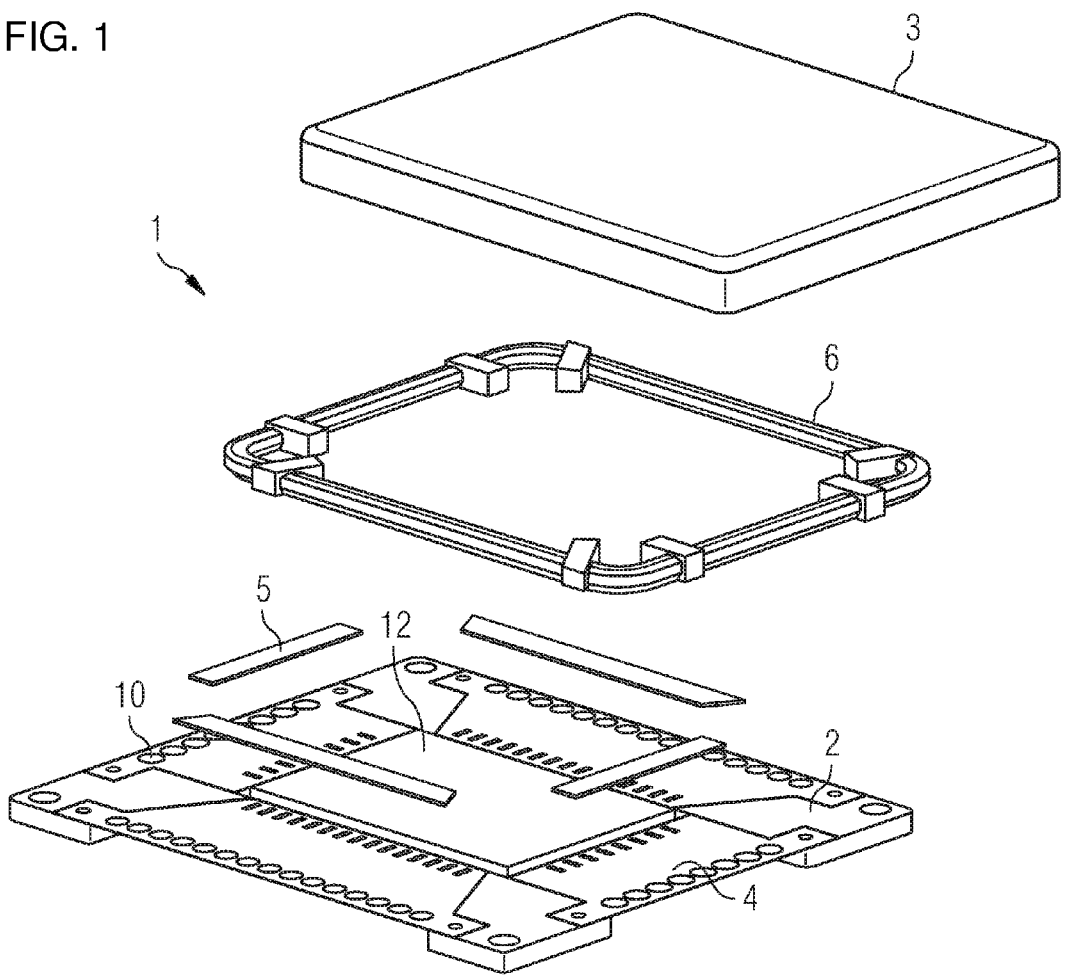
FIG. 1 shows a partially exploded perspective plan view of a housing base plate with fixed flexible partial printed circuit boards, a molded seal and a housing cover.

FIG. 1 shows an electronic control device 1, provided for integration into a motor vehicle transmission. The housing of the control device is formed by a metallic base plate 2 and a housing cover 3 made of aluminum sheet. Four flexible partial printed circuit boards 4 are fixed to the metallic base plate 2. The attachment surface for the housing cover 3 on the housing base arrangement is provided respectively in sub-regions with an adhesive film 5. An insertable molded seal (6) is also provided between the housing cover (3) and the housing base arrangement.

Figure 2:
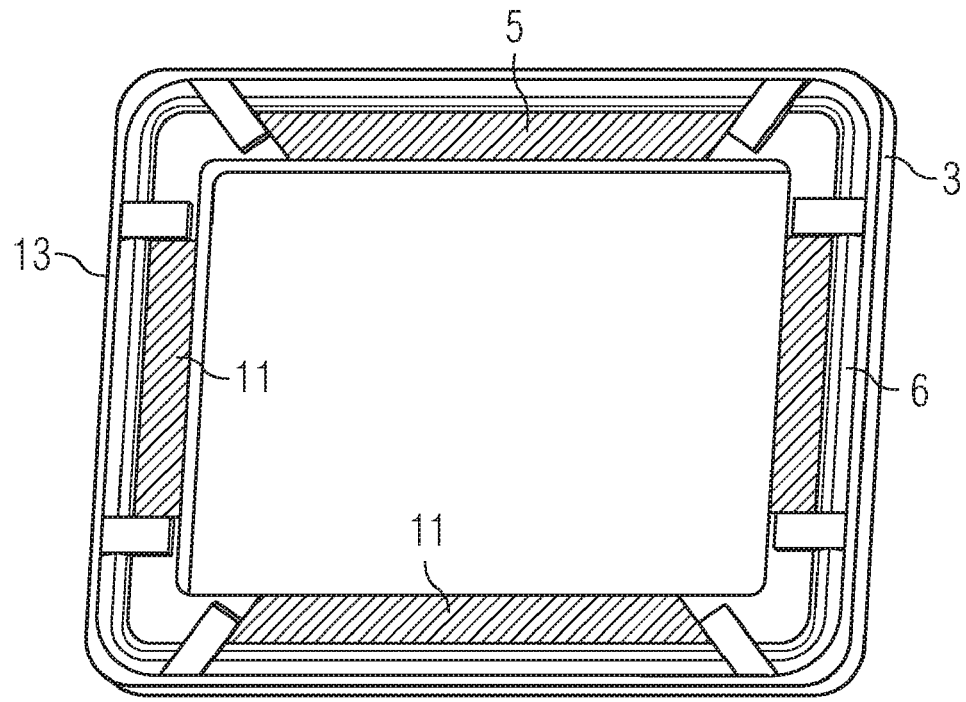
FIG. 2 shows a perspective plan view of a housing cover with inserted molded seal and adhesive film regions.

FIG. 2 shows a perspective plan view of the underside of a housing cover 3 with a molded seal 6 inserted into a peripheral depression or groove 13 and adhesive film regions 5. The planar regions 11 of the housing cover are disposed within the peripheral region with the molded seal in the inventive embodiment shown.

Figure 3:
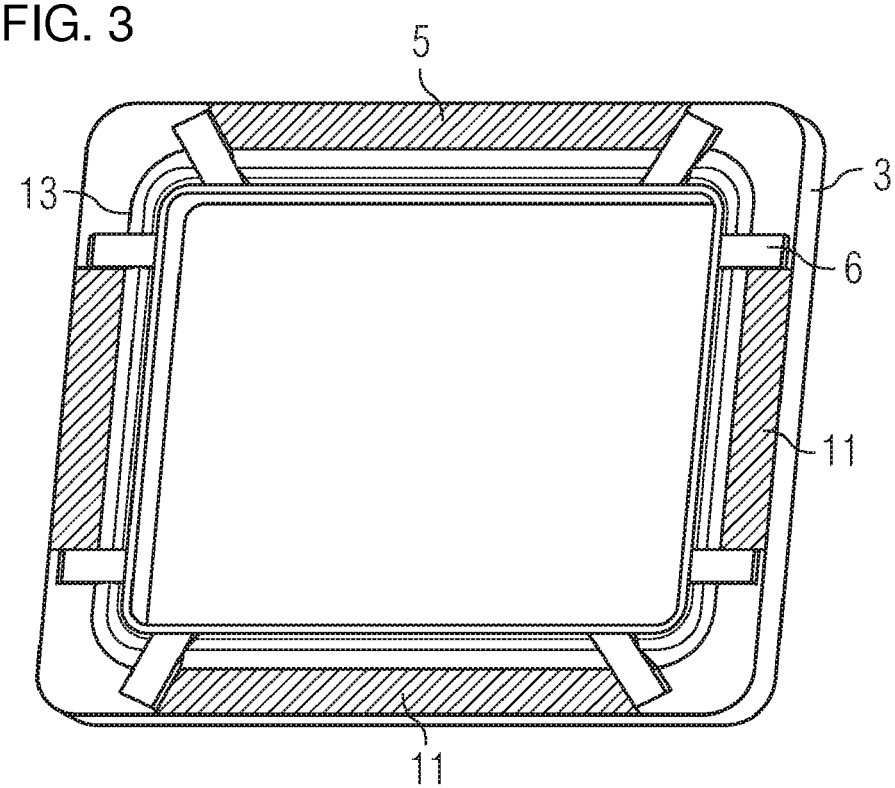
FIG. 3 shows a further alternative perspective plan view of a housing cover with inserted molded seal and adhesive film regions.

FIG. 3 shows a further perspective plan view of a housing cover 3 as an alternative to the embodiment in FIG. 2, with inserted molded seal 6 and planar regions 11 fitted with adhesive films 5. In the inventive embodiment shown the planar regions 11 of the housing cover are outside the peripheral region 13 with the molded seal 6.

In summary, an electronic assembly is proposed with a housing base and a housing cover and an electrical connection between the interior of the housing and the components outside the housing, wherein the housing cover is adhered directly to the electronic connection and/or to the housing base, thereby enabling permanently hermetically sealed protection of the electronic components within the housing, without having to provide additional rivets, screws or mechanical pretensioning. A flexible selection of materials for the molded seal is also possible, as the molded seal can now be inserted and has no adhesive function. It is thus possible to achieve a significant reduction in the errors of such assemblies due to fewer damaged interfaces. The inventive type of seal for the housing is also equally temperature resistant and resistant to mechanical and chemical stresses, due to aggressive mediums such as transmission oil for example. It can advantageously be used in a temperature range from −40° C. to +180° C.

The invention claimed is:

1. An electronic assembly for an integrated mechatronic system, comprising:

a housing base; a printed circuit board forming at least one electrical connection;

a housing cover having a marginal edge region formed with at least one planar region;

an adhesive film disposed to glue said planar region of said housing cover to at least one component selected from the group consisting of said electrical connection and said housing base; wherein said electrical connection is one of a plurality of electrical connections formed as flexible partial printed circuit boards; wherein a majority of said housing base is covered by said housing cover, wherein said housing cover has an underside formed with a peripheral region, and said peripheral region is configured to receive said molded seal and to map a contour thereof.

2. The electronic assembly according to claim 1, which further comprises a molded seal inserted between said housing cover and at least one component selected from the group consisting of said electrical connection and said housing base.

3. The electronic assembly according to claim 1, wherein said electrical connection projects outward from below said adhered housing cover.

4. The electronic assembly according to claim 1, wherein said adhesive film is a polymer film selected from the group consisting of epoxy, phenol, and acrylic polymers.

5. The electronic assembly according to claim 4, wherein said adhesive film is a pre-cross-linked acrylic adhesive film.

6. An electronic control device, comprising an electronic assembly according to claim 1 with a directly adhered housing cover.

7. A transmission controller of a motor vehicle, comprising an electronic assembly according to claim 1 with a directly adhered housing cover.

8. The electronic assembly according to claim 1, further comprising a molded seal forming a continuous seal between said housing cover and at least one component selected from the group consisting of said electrical connection and said housing base.

9. The electronic assembly according to claim 8, wherein said molded seal forms a hermetic seal.

10. The electronic assembly according to claim 8, wherein said housing cover is an outermost cover that is a part of a unit formed by the electronic assembly.

11. The electronic assembly according to claim 8, wherein said molded seal forms a hermetic seal that is resistant against transmission oil.

* * * * *